United States Patent

Smits

(10) Patent No.: US 6,830,944 B1
(45) Date of Patent: Dec. 14, 2004

(54) PIEZOELECTRIC BIMORPHS AS MICROELECTROMECHANICAL BUILDING BLOCKS AND CONSTRUCTIONS MADE USING SAME

(75) Inventor: Johannes G. Smits, JA Middelburg (NL)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 10/332,559

(22) PCT Filed: Jul. 10, 2001

(86) PCT No.: PCT/US01/21641

§ 371 (c)(1),
(2), (4) Date: Jul. 23, 2003

(87) PCT Pub. No.: WO02/04991

PCT Pub. Date: Jan. 17, 2002

Related U.S. Application Data

(63) Continuation-in-part of application No. 09/700,633, filed as application No. PCT/US00/07075 on Mar. 17, 2000, now Pat. No. 6,657,764.
(60) Provisional application No. 60/217,191, filed on Jul. 10, 2000, and provisional application No. 60/124,982, filed on Mar. 18, 1999.

(51) Int. Cl.[7] .............................................. H01L 21/00
(52) U.S. Cl. .......................................... 438/22; 347/54
(58) Field of Search .............................................. 438/3

(56) References Cited

U.S. PATENT DOCUMENTS

| | | | |
|---|---|---|---|
| 4,280,756 A | 7/1981 | Albertinetti | 350/360 |
| 4,496,211 A | 1/1985 | Daniel | 350/96.2 |
| 4,898,445 A | 2/1990 | Newell et al. | 350/96.2 |
| 5,049,775 A | 9/1991 | Smits | 310/328 |
| 5,178,012 A | 1/1993 | Culp | 73/510 |
| 5,441,600 A | 8/1995 | Smits | 216/51 |
| 5,559,387 A | 9/1996 | Beurrier | 310/32.8 |
| 6,443,558 B1 * | 9/2002 | Silverbrook | 347/54 |
| 6,488,358 B2 * | 12/2002 | Silverbrook et al. | 347/54 |
| 6,598,964 B2 * | 7/2003 | Silverbrook | 347/85 |

* cited by examiner

*Primary Examiner*—David Nelms
*Assistant Examiner*—Thao P. Le
(74) *Attorney, Agent, or Firm*—Weingarten, Schurgin, Gagnebin & Lebovici LLP

(57) ABSTRACT

A plurality of MEMS devices that can be easily configured to impart extended ranges of rotational and/or translational motion. The MEMS devices comprise a microelectromechanical building block including a bendable member having a first end connectable to a support structure, and a straight rigid member having a first end connected to a second end of the bendable member. In the event the bendable member is in a straight condition, the rigid member extends from the second end of the bendable member toward the support structure. Further, the bendable member has a predetermined length, and the rigid member has a length at least within a range from one half to the full predetermined length of the bendable member to allow a free end of the rigid member to undergo extended rotational and/or translational motion in response to a displacement of the bendable member. The respective MEMS devices can be employed as actuators or sensors in a variety of microelectromechanical and micro-opto-electromechanical applications.

27 Claims, 11 Drawing Sheets

US 6,830,944 B1

PIEZOELECTRIC BIMORPHS AS MICROELECTROMECHANICAL BUILDING BLOCKS AND CONSTRUCTIONS MADE USING SAME

CROSS REFERENCE TO RELATED APPLICATIONS

This application is a 371 of PCT/US01/21641, filed Jul. 10, 2001 which claims benefit of provisional appln 60/217,191 filed Jul. 10, 2000 and a CIP of application Ser. No. 09/700,633 filed Nov. 16, 2000 U.S. Pat. No. 6,657,764 which is a 371 PCT/US00/07075, filed Mar. 17, 2000 which claims benefit of provisional appln 60/124,982 filed Mar. 18, 1999.

STATEMENT REGARDING FEDERALLY SPONSORED RESEARCH OR DEVELOPMENT

N/A

BACKGROUND OF THE INVENTION

The present invention relates generally to the field of Micro-ElectroMechanical Systems (MEMS), and more specifically to MEMS devices that can be easily configured to provide extended ranges of rotational and/or translational motion.

MEMS devices have been widely employed as actuators or sensors in various micro-electromechanical applications including inkjet printers, read/write heads in computer disk drives, accelerometers, and pressure sensors. More recently, MEMS devices have been employed in optical networking applications including optical cross-connect modules for controlling switching between optical fiber input and output ports. For example, such optical cross-connects typically comprise two or three-dimensional arrays of optical mirrors configured to direct pluralities of beams of light from selected sets of fiber input ports to selected sets of fiber output ports. Further, conventional MEMS devices included in such optical cross-connects are configured to move at least some of the optical mirrors in the array under computer control to bring about a desired switching between the selected sets of fiber input and output ports.

MEMS devices employed in today's optical networking applications are frequently called upon to satisfy demanding performance requirements. For example, such MEMS devices are often required to move relatively large structures (e.g., optical mirrors, prisms, or optical gratings) over relatively large distances with high speed and a high degree of precision. However, conventional MEMS devices used in optical networking applications typically impart only limited ranges of linear or angular displacement. Further, such conventional MEMS devices are typically only capable of causing structures to rotate about a single axis.

It would therefore be desirable to have MEMS devices that can be employed as actuators or sensors in micro-electromechanical or micro-opto-electromechanical applications. Such MEMS devices would be easily configured to provide extended ranges of rotational and/or translational motion. It would also be desirable to have a MEMS device that can cause a structure such as an optical mirror to rotate about more than one axis.

BRIEF SUMMARY OF THE INVENTION

In accordance with the present invention, a plurality of MEMS devices is provided that can be easily configured to impart extended ranges of rotational and/or translational motion. Benefits of the presently disclosed invention are achieved by providing a micro-electromechanical building block, one or more of which can be used to construct a respective MEMS device capable of moving a desired angular and/or linear distance.

In a first embodiment, the micro-electromechanical building block includes at least one bendable member having a first end connectable to a support structure, and at least one straight rigid member having a first end connected to a second end of the bendable member. In the event the bendable member is in a straight condition, the rigid member extends from the second end of the bendable member toward the support structure. Further, the bendable member has a predetermined length, and the rigid member has a length within a range from one half to the full predetermined length of the bendable member to allow a free end of the rigid member to undergo extended rotational and/or translational motion in response to a displacement of the bendable member.

In a preferred embodiment, the support structure comprises a frame of silicon, the bendable member comprises a length of silicon having regions with depositions providing bender or piezoelectric morph functions when energized with a voltage, and the rigid member comprises a rigid silicon bar. The support structure, the bendable member, and the rigid member are formed from the same silicon wafer by way of a silicon micro-machining fabrication technique.

In further embodiments of the present invention, at least one micro-electromechanical building block comprising at least one bendable member connectable to at least one straight rigid member is used to construct respective MEMS devices capable of moving desired angular and/or linear distances.

A first MEMS device includes a first bendable member having a first end connectable to a support structure, and a first straight rigid member having a first end connected to a second end of the first bendable member. In the event the first bendable member is in a straight condition, the first rigid member extends toward the support structure. The first MEMS device also includes a second bendable member having a first end connected to a second end of the first rigid member, in which the first and second bendable members are configured to undergo respective displacements in a same direction; and, a second straight rigid member having a first end connected to a second end of the second bendable member. In the event the first and second bendable members are in respective straight conditions, the second rigid member extends toward the support structure. The first and second bendable members have the same predetermined length. Further, the first rigid member has a length equal to the predetermined length of the first and second bendable members, and the second rigid member has a length equal to one half of the length of the first rigid member to allow a free end of the second rigid member to undergo a pure rotation in response to a displacement of at least the first bendable member.

A second MEMS device includes a first bendable member having a first end connectable to a support structure, and a straight rigid member having a first end connected to a second end of the first bendable member. In the event the first bendable member is in a straight condition, the rigid member extends toward the support structure. The second MEMS device also includes a second bendable member having a first end connected to a second end of the rigid member. In the event the first and second bendable members are in respective straight conditions, the second bendable member extends away from the support structure. The first and second bendable members have the same predetermined length, and are configured to undergo respective displacements in opposite directions. Further, the rigid member has a length equal to one half of the predetermined length of the first and second bendable members to allow a free end of the second bendable member to undergo a pure translation in response to a displacement of at least the first bendable member.

A third MEMS device includes a first bendable member having a first end connectable to a support structure, and a second bendable member having a first end connected to a second end of the first bendable member. In the event the first and second bendable members are in respective straight conditions, the second bendable member extends away from the support structure. The first and second bendable members have the same predetermined length, and are configured to undergo respective displacements in opposite directions to allow a free end of the second bendable member to undergo a pure translation in response to a displacement of at least the first bendable member.

A fourth MEMS device includes a first bendable member having a first end connectable to a support structure, and a first straight rigid member having a first end connected to a second end of the first bendable member. In the event the first bendable member is in a straight condition, the first rigid member extends toward the support structure. The fourth MEMS device also includes a second bendable member having a first end connected to a second end of the first rigid member. In the event the first and second bendable members are in respective straight conditions, the second bendable member extends toward the support structure. The fourth MEMS device also includes a second straight rigid member having a first end connected to a second end of the second bendable member. In the event the first and second bendable members are in respective straight conditions, the second rigid member extends away from the support structure. The first and second bendable members have the same predetermined length, and are configured to undergo respective displacements in a same direction. Further, the first and second rigid members have respective lengths equal to one half of the predetermined length of the first and second bendable members to allow a free end of the second rigid member to undergo a pure translation in response to a displacement of at least the first bendable member.

By employing at least one micro-electromechanical building block to construct a plurality of MEMS devices, respective MEMS devices capable of moving desired angular and/or linear distances can be easily configured. Further, the respective MEMS devices can be employed as actuators or sensors in a variety of micro-electromechanical and micro-opto-electromechanical applications.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which:

FIG. 2b is a top plan view of the first micro-electromechanical building block of FIG. 2a;

FIG. 3b is a top plan view of the second micro-electromechanical building block of FIG. 3a;

FIG. 4b is a top plan view of the first MEMS device of FIG. 4a;

FIG. 5b is a top plan view of the second MEMS device of FIG. 5a;

FIG. 6b is a top plan view of the third MEMS device of FIG. 6a;

FIG. 7b is a top plan view of the fourth MEMS device of FIG. 7a;

DETAILED DESCRIPTION OF THE INVENTION

The entire disclosure of U.S. patent application Ser. No. 09/700,633 filed Nov. 16, 2000 is incorporated herein by reference.

The entire disclosure of U.S. Provisional Patent Application No. 60/217,191 filed Jul. 10, 2000 is incorporated herein by reference.

A plurality of MEMS devices is disclosed that can be easily configured to provide extended ranges of rotational and/or translational motion. The presently disclosed MEMS devices achieve such extended ranges of motion by way of a micro-electromechanical building block, at least one of which can be used to construct a respective MEMS device capable of moving a desired angular and/or linear distance.

Figure 2A:
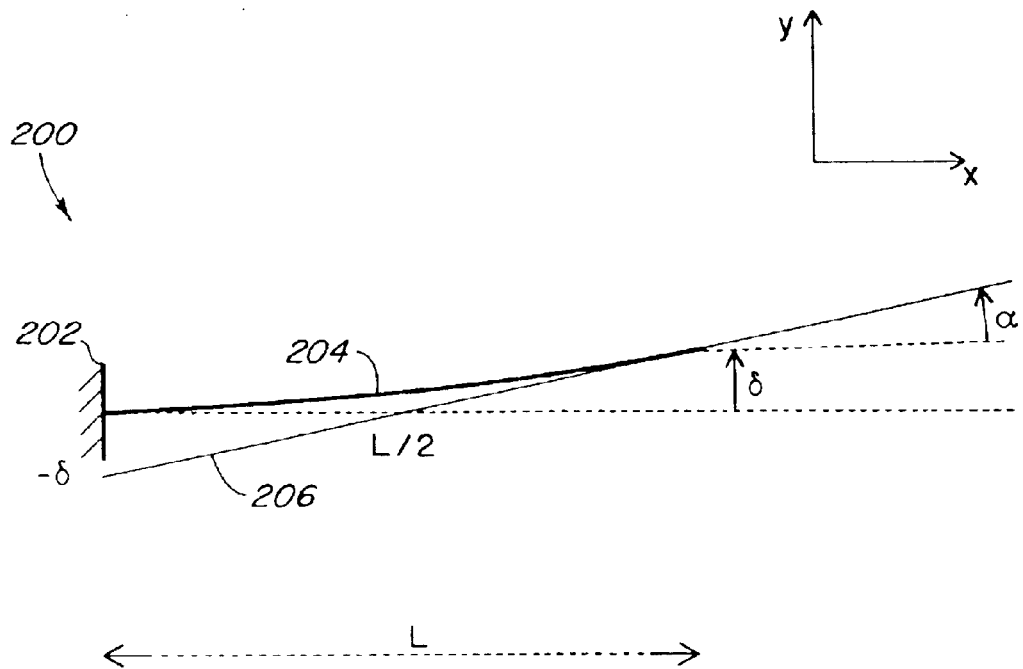
FIG. 2a is a side view of a first micro-electromechanical building block including the piezoelectric morph device of FIG. 1, in accordance with the present invention.

FIG. 2a depicts a side view of a first micro-electromechanical building block 200 according to the present invention. In the illustrated embodiment, the micro-electromechanical building block 200 includes a bendable member 204 having a first end connected to a support structure 202, and a straight rigid member 206 having a first end connected to a second end of the bendable member 204. The straight rigid member 206 is connected to the bendable member 204 such that when the bendable member 204 is in a straight condition, the straight rigid member 206 extends from its connection with the bendable member 204 toward the support structure 202.

In a preferred embodiment, the bendable member 204 comprises a piezoelectric bender, which can be made to bend away from a planar position by applying an electric field across at least one piezoelectric layer deposited on a surface thereof. For example, the piezoelectric bender 204 may comprise either a "mono-morph" or a "bimorph" (the term "morph" being used to represent either of other equivalent structures described herein). Further, the micro-electromechanical building block 200 is preferably formed from a silicon wafer by a conventional silicon micro-machining process. Accordingly, the support structure 202 comprises a frame of silicon, the bendable member 204 comprises a length of silicon having regions with depositions providing bender or piezoelectric morph functions when energized by an applied voltage, and the rigid member 206 comprises a rigid silicon bar.

It is understood that the bendable member 204 may alternatively comprise a piezo-magnetic bender that can be made to bend away from a planar position by application of a magnetic field across at least one piezo-magnetic layer deposited thereon, or any other type of bender that can be made to bend by inducing a stress gradient (via, e.g., an electric field, a magnetic field, or an application of heat or radiation) along a dimension of the bender.

Figure 1:
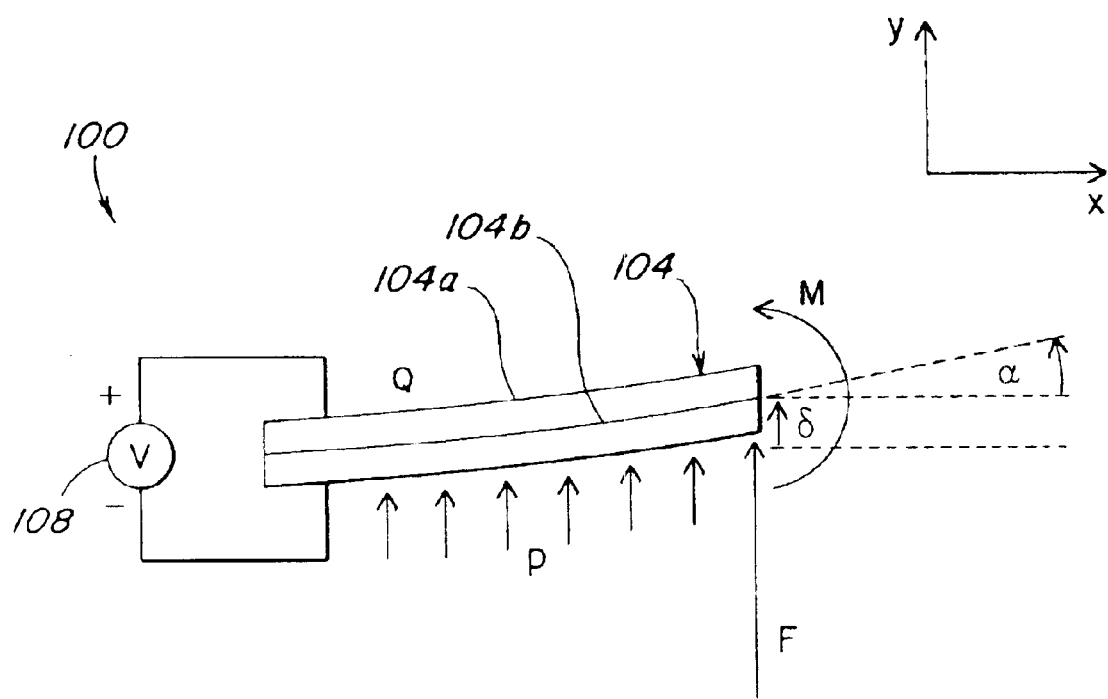
FIG. 1 is a schematic diagram depicting a piezoelectric morph device energized with a voltage.

FIG. 1 depicts a schematic diagram of a piezoelectric bender 104 coupled to a voltage source 108. The piezoelectric bender 104 is representative of the bendable member 204 included in the micro-electromechanical building block 200 (see FIG. 2a). Accordingly, when energized by a voltage "V" applied by the voltage source 108, the piezoelectric bender 104 provides desired bender or piezoelectric morph functions.

Specifically, the piezoelectric bender 104 comprises a length of silicon having a first piezoelectric deposition region 104a and a second piezoelectric deposition region 104b. When the voltage V is applied by the voltage source 106, one of the piezoelectric deposition regions 104a or 104b expands while the other piezoelectric deposition region contracts, thereby causing the piezoelectric bender 104 to bend by an amount proportional to the applied voltage, V.

Those of ordinary skill in the art will appreciate that a piezoelectric bimorph energized by an applied voltage is subject to a plurality of external variables including a tip moment "M", a tip force "F", a pressure "p", and the applied voltage V. It will also be appreciated that canonical conjugates of these four (4) variables are a tip rotation "$\alpha$", a tip translation "$\delta$", a displaced volume "V", and an electrode charge "Q", respectively.

Each of these external variables M, F, p, and V and their respective conjugates $\alpha$, $\delta$, V, and Q are depicted in FIG. 1 relative to the piezoelectric bender 104. The tip rotation $\alpha$ and the tip translation $\delta$ are also depicted in FIG. 2a relative to the micro-electromechanical building block 200 (see also FIGS. 3a, 4a, 5a, 6a, and 7a).

It should further be appreciated that the tip rotation a is proportional to the tip translation $\delta$ according to the following equation:

$$\alpha = 2\delta/L, \quad (1)$$

in which "L" is the length of the bendable member 204 (see FIG. 2a).

Accordingly, when the connection between the support structure 202 and the bendable member 204, as depicted in FIG. 2a, is conceptually placed at the origin of an x-y coordinate system, the bendable member 204 extends in the x-direction and deflects in the y-direction. Further, the tangent rigid member 206 connected at the tip of the bendable member 204 intersects the x-axis at a distance "L/2" from the origin, and intersects the y-axis at a distance "$-\delta$" from the origin.

Both the bendable member 204 and the tangent rigid member 206 are herein defined as standard MEMS elements of the micro-electromechanical building block 200. Specifically, the bendable member 204 and the rigid member 206 are herein referred to as a bimorph and an "extender", respectively. Although the extender 206 connected to the bimorph 204 is depicted in FIG. 2a as pointing in the positive x-direction, it is understood that the extender 206 may be suitably connected to the bimorph 204 to allow it to point in the negative x-direction. The extender 206 pointing in the positive x-direction is herein referred to as a "forward extender", and the extender 206 pointing in the negative x-direction is herein referred to as a "reverse extender". Similarly, the bimorph 204 extending in the positive x-direction is herein referred to as a "forward bimorph", and the bimorph 204 extending in the negative x-direction is herein referred to as a "reverse bimorph".

Further, although the bimorph 204 is shown in FIG. 2a as bending in the positive y-direction, it is understood that the bimorph 204 may be suitably configured to bend in the negative y-direction. The forward bimorph 204 bending in the positive y-direction is herein referred to as a "forward positive bimorph", and the forward bimorph 204 bending in the negative y-direction is herein referred to as a "forward negative bimorph". Similarly, the reverse bimorph 204 bending in the positive y-direction is herein referred to as a "reverse positive bimorph", and the reverse bimorph 204 bending in the negative y-direction is herein referred to as a "reverse negative bimorph".

Figure 2B:
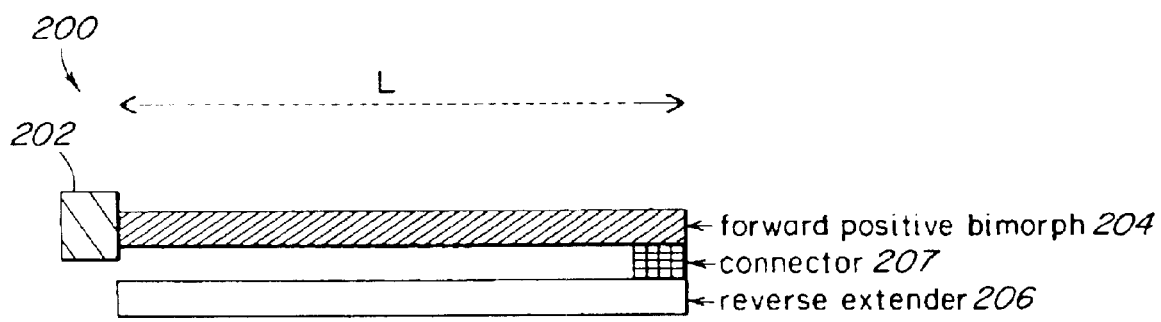

FIG. 2b depicts a top plan view of the micro-electromechanical building block 200. Specifically, the top plan view shows the supporting structure 202, the forward positive bimorph 204, the reverse extender 206, and a suitable silicon micro-machined connector 207 disposed between the bimorph 204 and the extender 206. In the illustrated embodiment, the length of the extender 206 is equal to the length L of the bimorph 204. The extender 206 having a length equal to that of the bimorph 204 to which it is connected is herein referred to as a "full extender".

It is noted that while the free end of the full reverse extender 206 intersects the y-axis at the distance $-\delta$ from the origin, the midpoint of the full reverse extender 206 undergoes rotation, only. This is because the midpoint of the full reverse extender 206 is at the equilibrium midpoint of the forward positive bimorph 204.

Figure 3A:
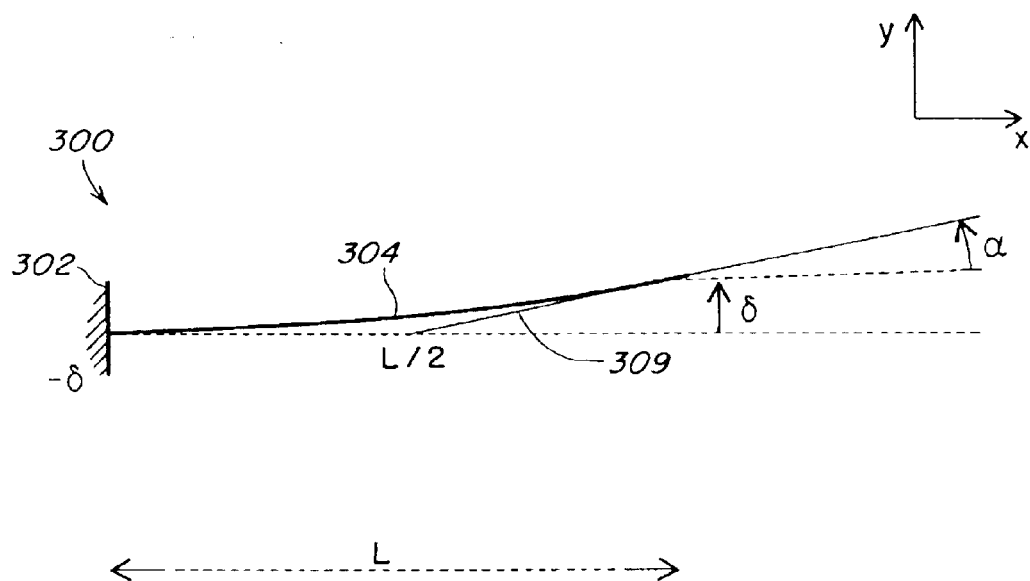
FIG. 3a is a side view of a second micro-electromechanical building block including the piezoelectric morph device of FIG. 1, in accordance with the present invention.

FIG. 3a depicts a side view of a second micro-electromechanical building block 300 according to the present invention. In the illustrated embodiment, the micro-electromechanical building block 300 includes a forward positive bimorph 304 having a first end connected to a support structure 302, and a reverse extender 309 having a first end connected to a second end of the bimorph 304.

Figure 3B:
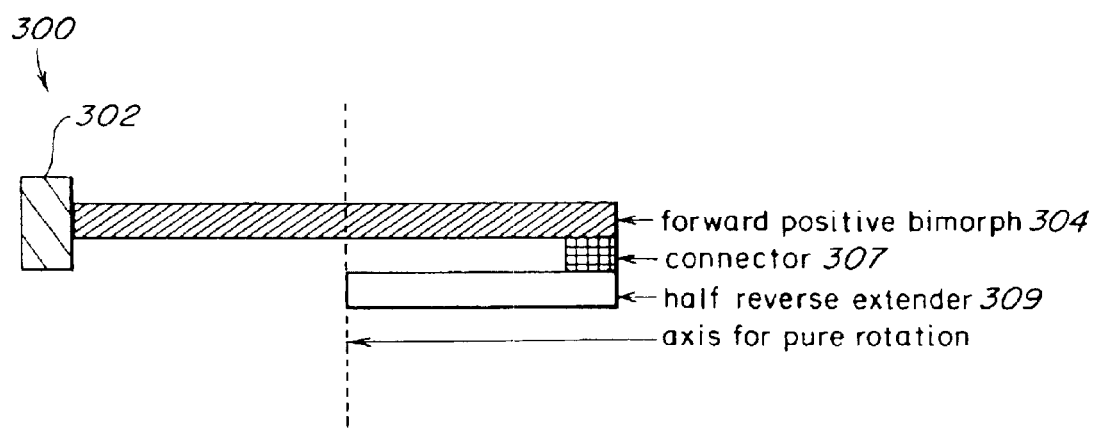

As described above, the midpoint of the full reverse extender undergoes pure rotation because it is at the equilibrium midpoint of the forward positive bimorph to which it is connected. A top plan view of the micro-electromechanical building block 300 comprising the support structure 302, the forward bimorph 304, the reverse extender 309, and a suitable silicon macro-machined connector 307 disposed between the bimorph 304 and the extender 309 (see FIG. 3b) shows that the length of the extender 309 is equal to one half the length L of the bimorph 304. Accordingly, the free end of the reverse extender 309 undergoes pure rotation because it is at the equilibrium midpoint of the forward positive bimorph 304.

Both the forward bimorph 304 and the reverse extender 309 are herein defined as standard MEMS elements of the micro-electromechanical building block 300. It is noted that the extender 309 having a length equal to one half that of the bimorph 304 to which it is connected is herein referred to as a "half extender".

Although the micro-electromechanical building block 200 includes the full reverse extender 206 (see FIG. 2a), and the micro-electromechanical building block 300 includes the half reverse extender 309 (see FIG. 3a), it is understood that each of the extenders 206 and 309 may alternatively have a respective length at least within a range from one half to the full length of the bimorph connected thereto to allow the free end of the extender to undergo a desired rotational and/or translational motion.

The standard MEMS elements of the micro-electromechanical building blocks 200 and 300 can be connected to each other in various combinations to construct MEMS devices capable of moving desired angular and/or linear distances.

Figure 4A:
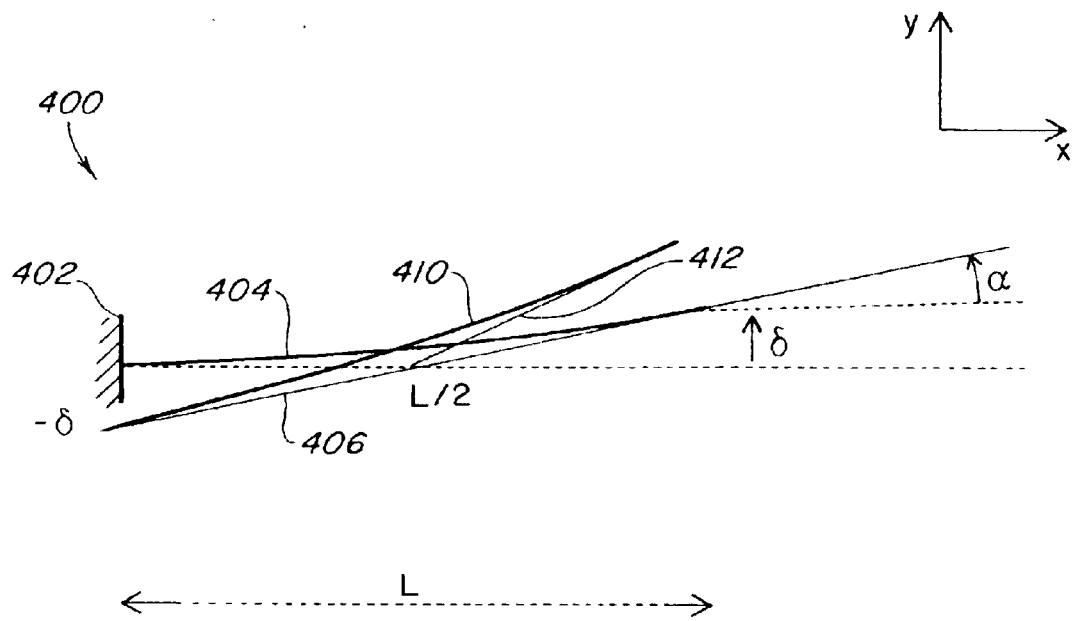
FIG. 4a is a side view of a first MEMS device including the first and second micro-electromechanical building blocks of FIGS. 2a and 3a, in accordance with the present invention.
Figure 4B:
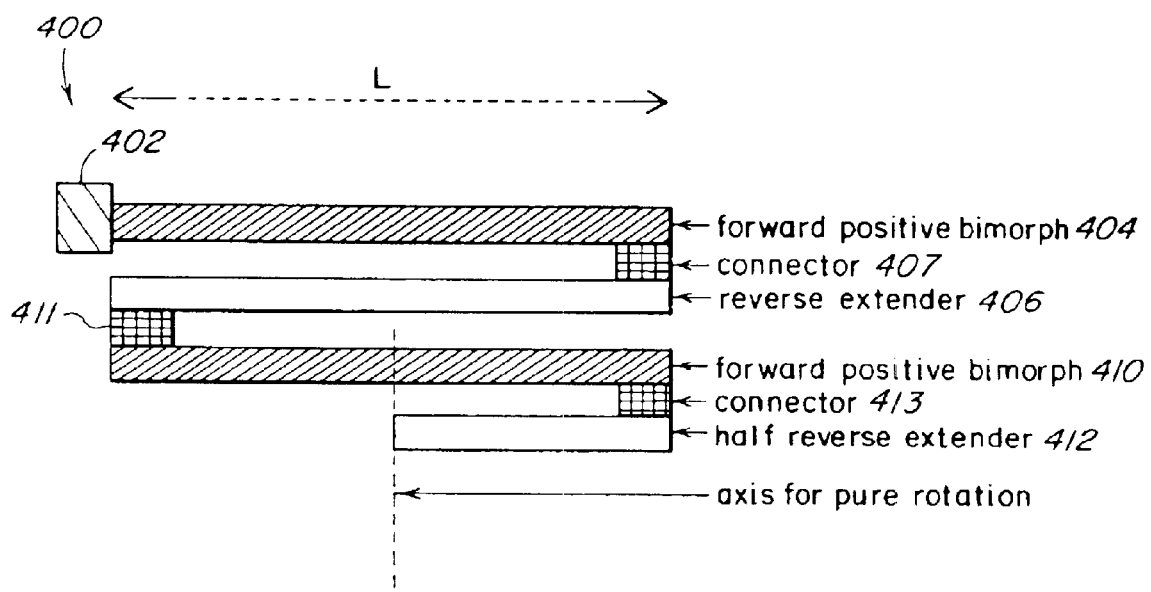

FIG. 4a depicts a side view of a first MEMS device 400 constructed using a combination of the standard MEMS elements of the micro-electromechanical building blocks 200 and 300 (see FIGS. 2a and 3a), in accordance with the present invention. Further, FIG. 4b depicts a top plan view of this first MEMS device 400, which is constructed to undergo a pure rotation $\alpha$ at the tip of a half reverse extender 412.

In the illustrated embodiment, the first MEMS device 400 includes a forward positive bimorph 404 having a first end connected to a support structure 402, a full reverse extender 406 having a first end connected to a second end of the forward positive bimorph 404, a forward positive bimorph 410 having a first end connected to a second end of the full reverse extender 406, and the half reverse extender 412 having a first end connected to a second end of the forward positive bimorph 410.

It is noted that the combination of the forward positive bimorph 404 and the full reverse extender 406 conforms to the general configuration of the micro-electromechanical building block 200 (see FIG. 2a), and the combination of the forward positive bimorph 410 and the half reverse extender 412 conforms to the general configuration of the micro-electromechanical building block 300 (see FIG. 3a).

Moreover, the net result of the bending forward positive bimorph 404 and its connection to the full reverse extender 406, and the bending forward positive bimorph 410 and its connection to the half reverse extender 412 is that the tip of the half reverse extender 412 undergoes a rotation a without translation.

Figure 5A:
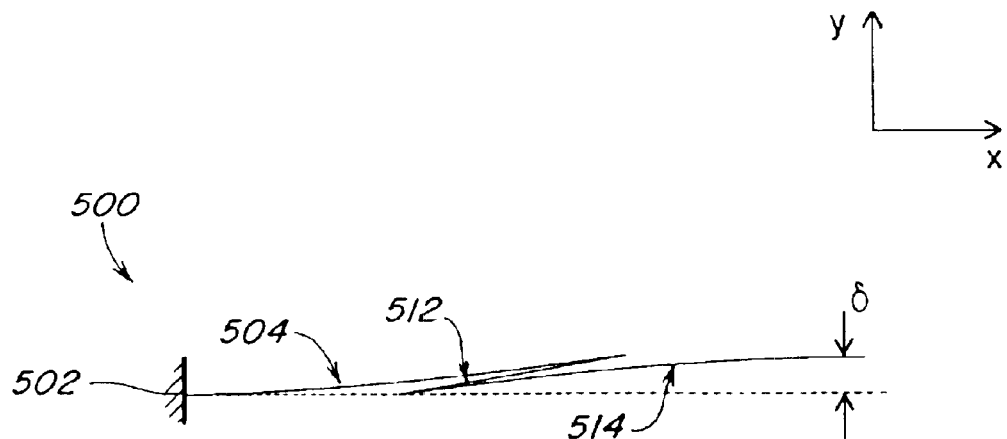
FIG. 5a is a side view of a second MEMS device including the second micro-electromechanical building block of FIG. 3a, in accordance with the present invention.
Figure 5B:
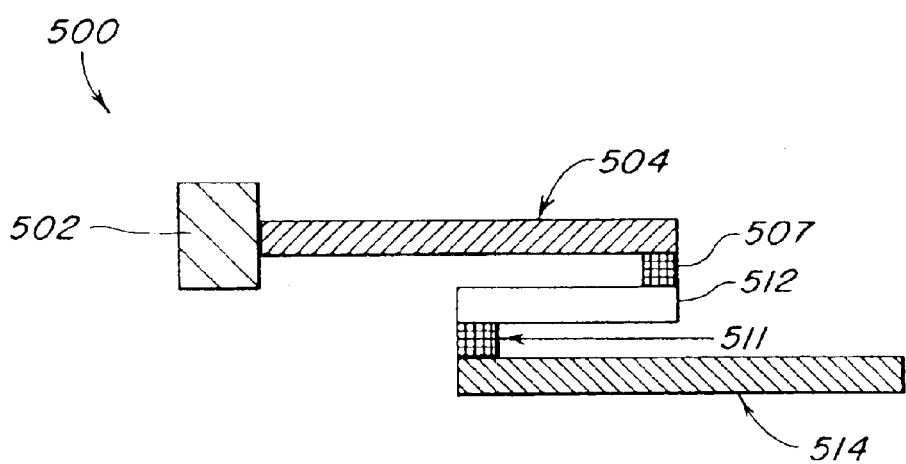

FIG. 5a depicts a side view of a second MEMS device 500 constructed using the standard MEMS elements of the micro-electromechanical building blocks 200 and 300 (see FIGS. 2a and 3a), in accordance with the present invention. Further, FIG. 5b depicts a top plan view of this second MEMS device 500, which is constructed to undergo a pure translation $\delta$ at the tip of a forward negative bimorph 514.

In the illustrated embodiment, the second MEMS device 500 includes a forward positive bimorph 504 having a first end connected to a support structure 502, a half reverse extender 512 having a first end connected to a second end of the forward positive bimorph 504, and the forward negative bimorph 514 having a first end connected to a second end of the half reverse extender 512.

It is noted that the combination of the forward positive bimorph 504 and the half reverse extender 512 conforms to the general configuration of the micro-electromechanical building block 300 (see FIG. 3a).

Moreover, the net result of the bending forward positive bimorph 504 and its connection to the half reverse extender 512, and the bending forward negative bimorph 514 is that the tip of the forward negative bimorph 514 undergoes a translation $\delta$ without rotation. The construction of this second MEMS device 500 is herein referred to as a "single delta translator".

Figure 6A:
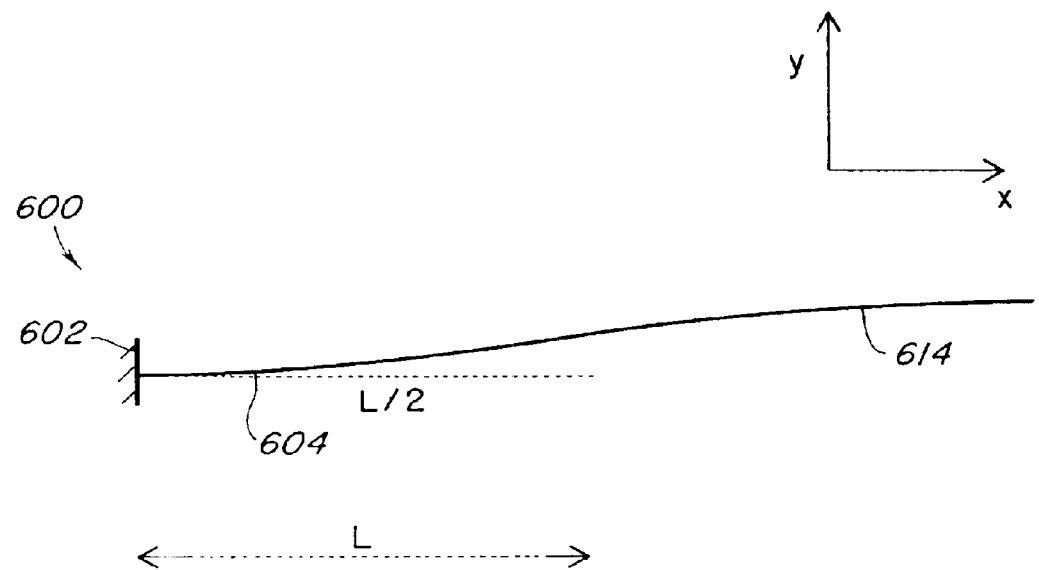
FIG. 6a is a side view of a third MEMS device, in accordance with the present invention.
Figure 6B:
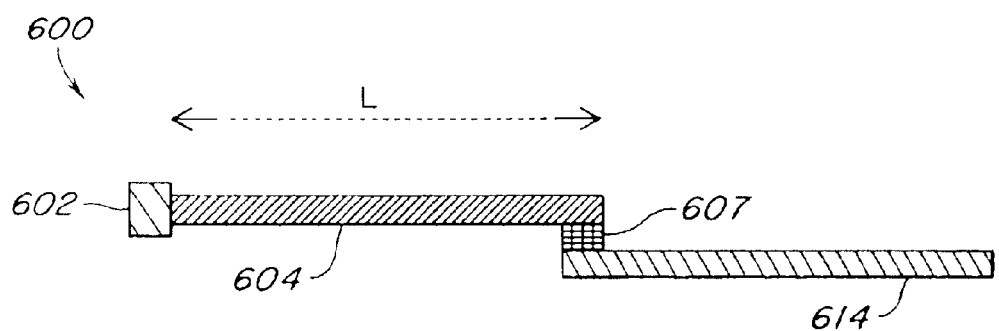

FIG. 6a depicts a side view of a third MEMS device 600 constructed using the standard MEMS elements of the micro-electromechanical building blocks 200 and 300 (see FIGS. 2a and 3a), in accordance with the present invention. Further, FIG. 6b depicts a top plan view of this third MEMS device 600, which is constructed to undergo an extended range of pure translational motion $2\delta$ at the tip of a forward negative bimorph 614.

In the illustrated embodiment, the third MEMS device 600 includes a forward positive bimorph 604 having a first end connected to a support structure 602, and the forward negative bimorph 614 having a first end connected to a second end of the forward positive bimorph 604.

Moreover, the net result of the bending forward positive bimorph 604 and the bending forward negative bimorph 614 is that the tip of the forward negative bimorph 614 undergoes an extended translation $2\delta$ without rotation. The construction of this third MEMS device 600 is herein referred to as a "double delta translator".

Figure 7A:
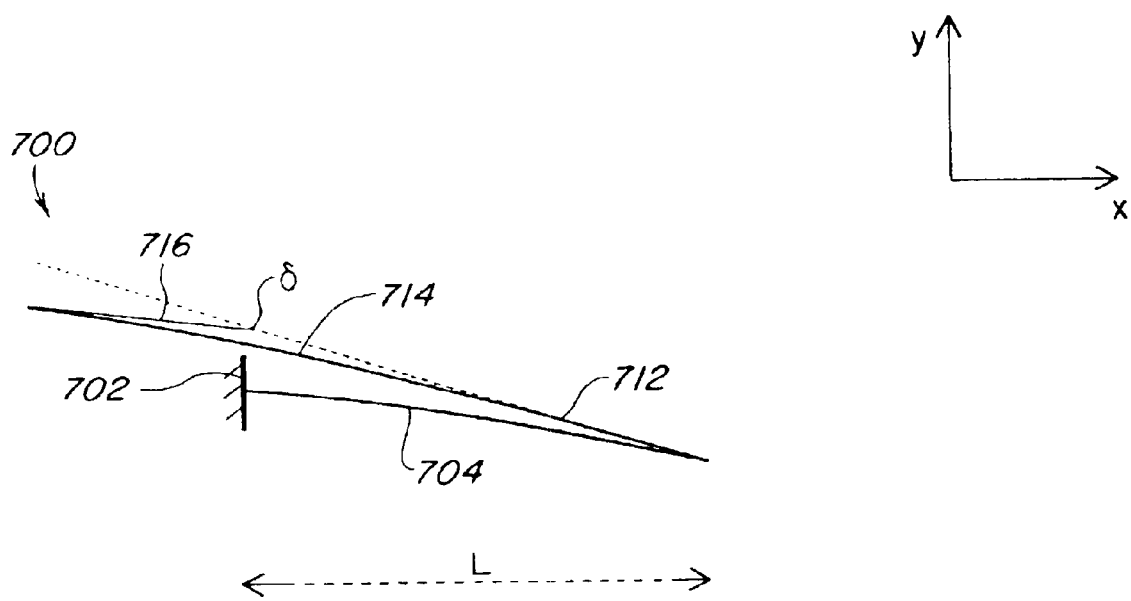
FIG. 7a is a side view of a fourth MEMS device including the second micro-electromechanical building block of FIG. 3a, in accordance with the present invention.
Figure 7B:
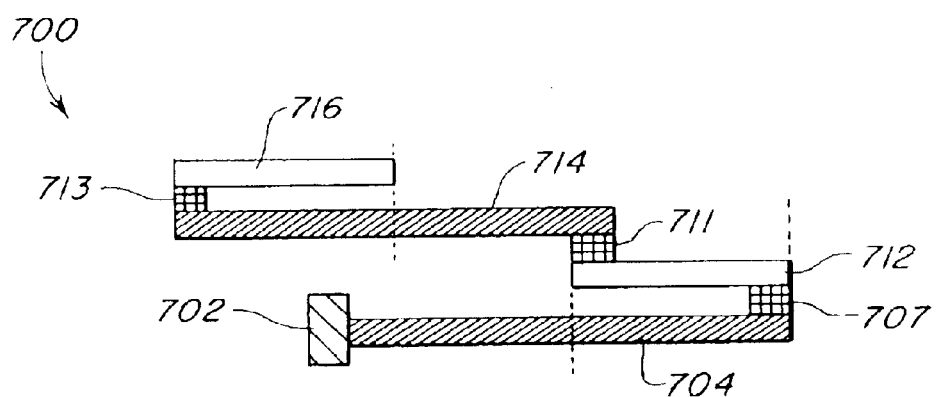

FIG. 7a depicts a side view of a fourth MEMS device 700 constructed using the standard MEMS elements of the micro-electromechanical building blocks 200 and 300 (see FIGS. 2a and 3a), in accordance with the present invention. Further, FIG. 7b depicts a top plan view of this fourth MEMS device 700, which is constructed to undergo a pure translation $\delta$ at the tip of a half forward extender 716.

In the illustrated embodiment, the fourth MEMS device 700 includes a forward negative bimorph 704 having a first end connected to a support structure 702, a half reverse extender 712 having a first end connected to a second end of the forward negative bimorph 704, a reverse negative bimorph 714 having a first end connected to a second end of the half reverse extender 712, and the half forward extender 716 having a first end connected to a second end of the reverse negative bimorph 714.

Moreover, the net result of the bending forward negative bimorph 704 and its connection to the half reverse extender 712, and the bending of the reverse negative bimorph 714 and its connection to the half reverse extender 716 is that the tip of the half reverse extender 716 undergoes a translation $\delta$ without rotation. The construction of this fourth MEMS device 700 therefore comprises another single delta translator.

It is noted that the standard MEMS elements of the micro-electromechanical building blocks 200 and 300 and/or the first, second, third, or fourth MEMS devices 400, 500, 600, or 700 may be suitably stacked to form higher order rotators and translators. Further, in order to avoid twisting moments, these constructions can be made symmetrical by mirroring them. For example, a translator may be formed in which a MEMS device and its mirrored counterpart provide a connection to a structure comprising an optical surface (e.g., an optical mirror, a prism, or an optical grating—either transparent or reflective) such that the tip of the last MEMS element of the translator is allowed to undergo a desired translational motion with no twisting moments.

Figure 8:
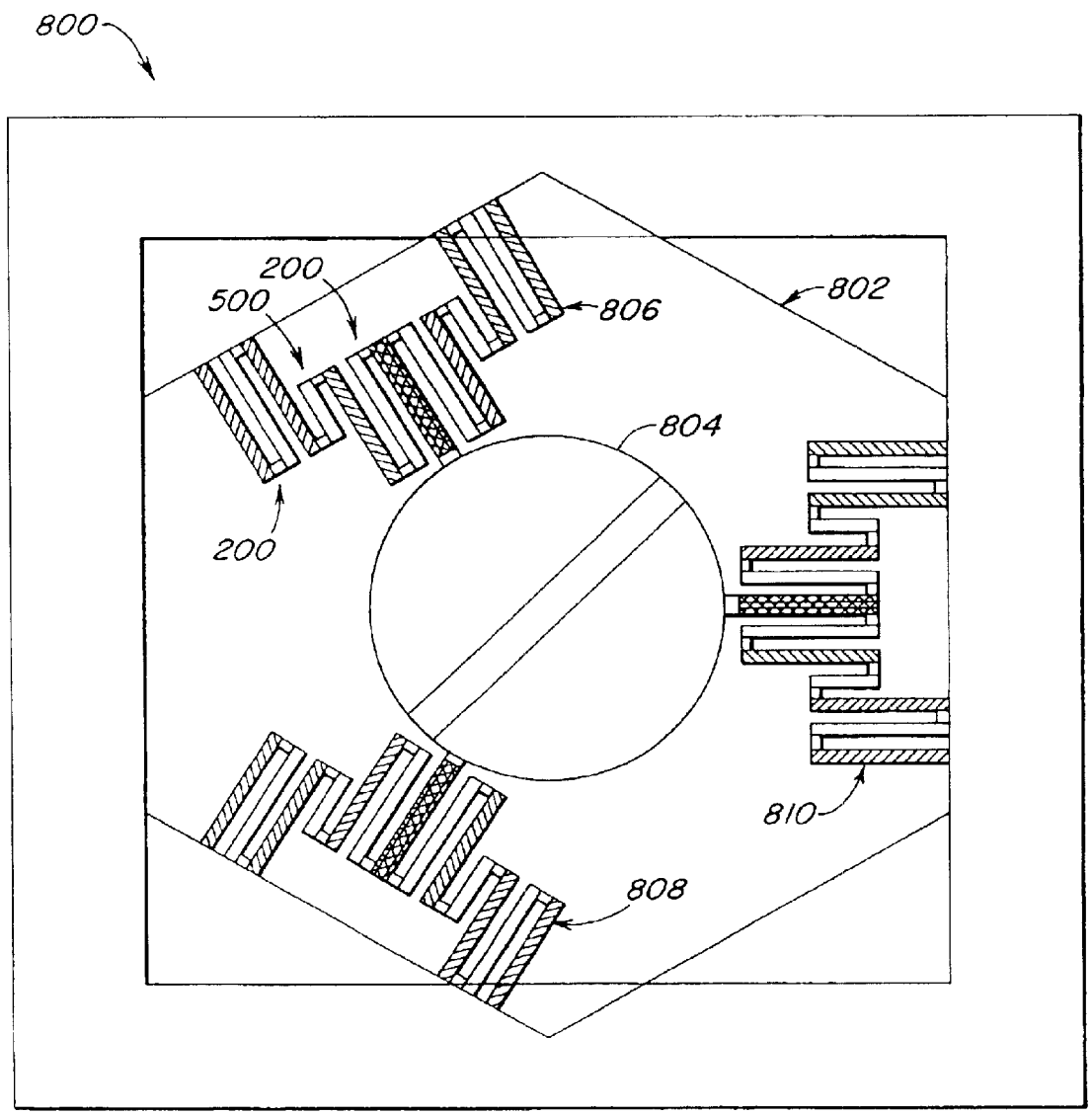
FIG. 8 is a top plan view of an optical cross-connect module including mirrored configurations of the second MEMS device of FIG. 5a, in accordance with the present invention.

FIG. 8 depicts an optical cross-connect module 800 according to the present invention. In the illustrated embodiment, the optical cross-connect module 800 includes a switching unit 802 comprising an optical mirror positioned on a platform 804, which is connected to three (3) sets of double delta translators 806, 808, and 810 positioned at angles of about 120° from each other. Specifically, the double delta translator 806 is formed by mirroring a stack comprising the second MEMS device 500 connected between two (2) micro-electromechanical building blocks 200. The double delta translators 808 and 810 are formed in a similar manner. Accordingly, when the double delta translators 806, 808, and 810 are energized with suitable applied voltages, the platform 804 is raised (lowered) to insert (remove) the optical mirror in (from) the path of light beams emitted from optical fiber ports (not shown).

It is noted that the raising (lowering) of the platform 804 may alternatively be achieved by employing more than one set of single, double, triple, or higher order translators.

Figure 9:
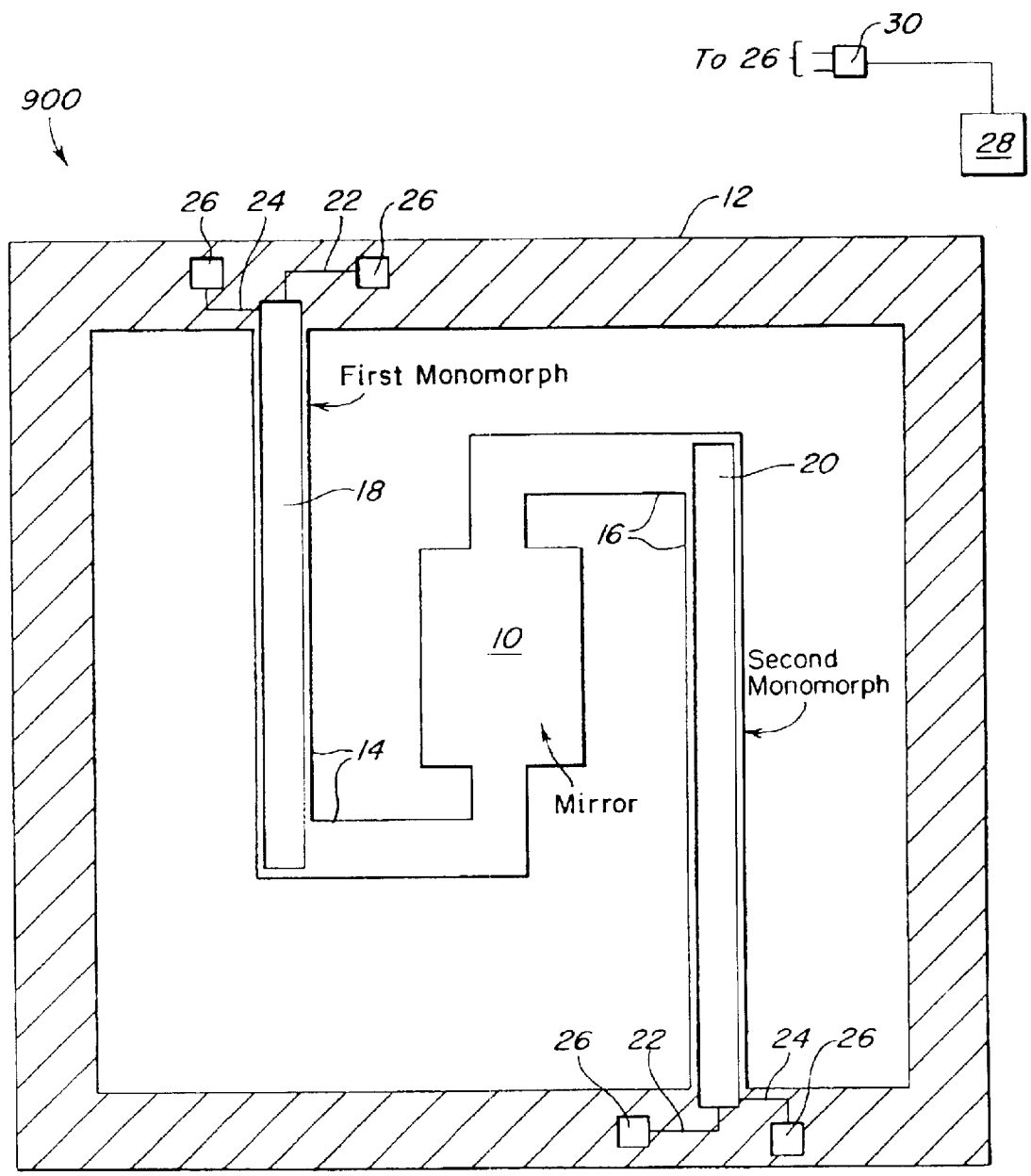
FIG. 9 is a top plan view of a two-morph mirror scanning system, in accordance with the present invention.

FIG. 9 depicts a top plan view of a two-morph mirror scanning system 900 according to the present invention. In the illustrated embodiment, the two-morph mirror scanning system 900 includes a mirrored silicon platform or area 10 supported and etch-released from a silicon frame 12 by respective silicon support arms 14 and 16. Overlying the arms 14 and 16 are respective morphs 18 and 20 that may be mono-morphs or bimorphs. The morphs 18 and 20 comprise piezoelectric depositions formed during the silicon micromachining of the device. In their configurations as benders, the morphs 18 and 20 have upper and lower electrical connections 22 and 24 to terminals 26, each formed as a metalization on the frame 12. It is noted that the frame 12 is merely shown schematically, and typically would be of greater extent in both directions of the plane of the page.

Figure 10:
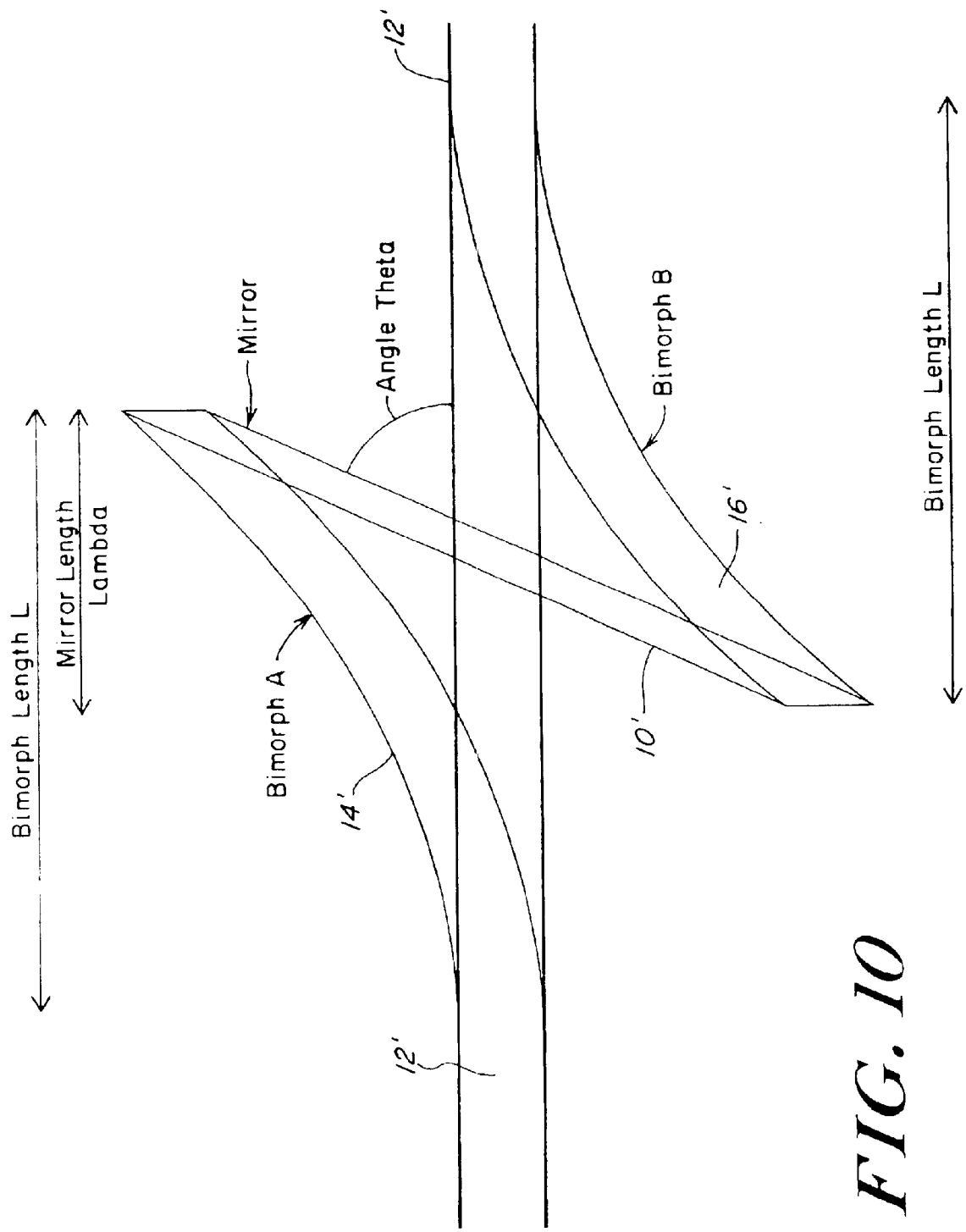
FIG. 10 is a drawing depicting the operation of the mirror scanning system of FIG. 9.

FIG. 10 depicts a diagrammatic illustration of the principle of operation of the two-morph mirror scanning system 900 according to the present invention, in which a mirror 10' is supported on arms 14' and 16' within a frame 12'. As the morphs or bimorphs of the arms 14' and 16' are electrically actuated to bend in opposite directions, the mirror 10' can be tilted a considerable distance. By varying and controlling the signals applied to the morphs, the degree of bending and the angle of inclination of the mirror 10' can be precisely set or scanned with knowledge of the exact position of the mirror. For this purpose, the system of the invention is normally operated with a microprocessor or other processor 28 (see FIG. 9), which controls the magnitude of the signals applied to terminals 26 with or without interfacing drivers 30 (see FIG. 9).

It is noted that the respective combinations of the arm 14' and the mirror 10', and the arm 16' and the mirror 10', conform to the general configuration of the micro-electromechanical building block 200 (see FIG. 2a). Further, because the midpoint of the mirror 10' is at the respective equilibrium midpoints of the arms 14' and 16', the midpoint of the mirror 10' undergoes rotation without translation. The midpoint of the mirror 10' therefore comprises the axis of rotation of the mirror 10'.

Figure 11:
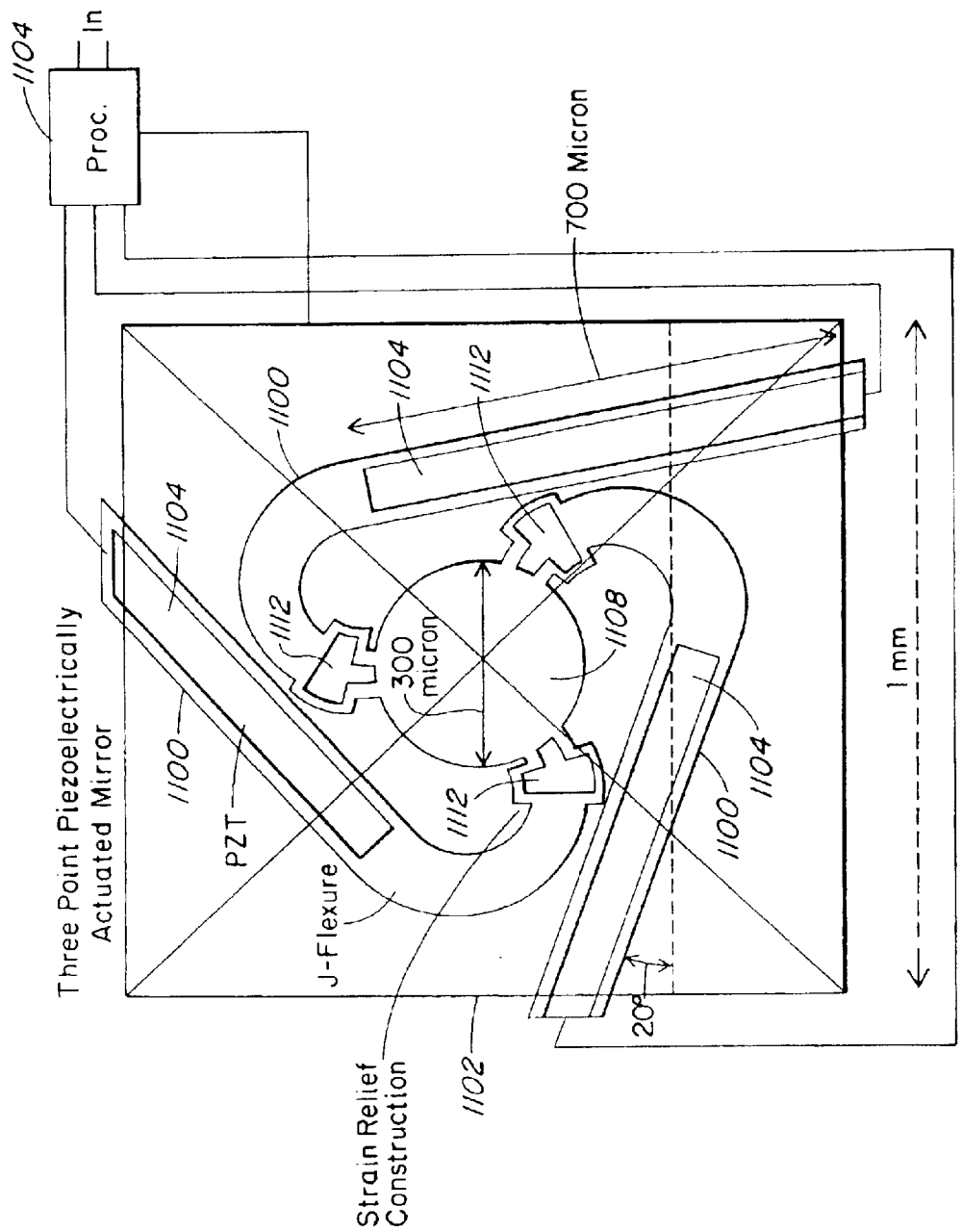
FIG. 11 is a top plan view of a three-morph mirror scanning system, in accordance with the present invention.

FIG. 11 depicts a further embodiment of the present invention, in which three "J" shaped arms 1100, completing nearly a 180° curvature and angled at 120° from each other, are supported from the edge 1102 of a frame. The initial linear portion 1104 of the arms 1100 is plated to function as morphs or benders. A computation system 1106 drives the morphs and accomplishes any coordinate transformations necessary to adjust orthogonal drive signals to the 120° angles. A mirror 1110 is formed in the center, as described above.

Stress relief structures 1112 are formed of silicon between the ends of the arms 1100 and the mirror 1108 to accommodate a difference in slope between the sides of the arms 1100 at the juncture with the mirror due to the substantial curving of the arms 1100 at the end and the 120° arm placement. The stress relief structures 1112 comprise a widening of the arms with the centers etched out leaving only outer bands for the attachment over a few degrees of curvature. In a preferred embodiment, the midpoint of the initial linear portion 1104 of each of the three (3) arms 1100 is in line with the stress relief structures 1112 of the remaining two (2) arms 1100. In this configuration, the arms 1100 can cause the mirror 1108 to move with minimal stress and inertia.

Of particular advantage to such a structure is the fact that if the morphs or benders on the arm portions 1104 are electrically driven to bend in the same direction by an identical amount, or nearly so, the mirror 1110 is given a bending moment at its edges where the arms attach. This results in the mirror 1110 being bent slightly in a convex or concave shape, which has usefulness in providing focusing or defocusing effects on light beams reflected thereby.

Although "bimorphs" and "extenders" are herein described as distinct standard MEMS elements of the micro-electromechanical building blocks 200 and 300 (see FIGS. 2a and 3a), it should be understood that a bimorph may be configured to act as a bender and/or an extender. For example, by applying suitable voltages to a bimorph, the bimorph can be transformed from a positive/negative bimorph to an extender and from the extender back to the positive/negative bimorph.

Moreover, even though the micro-electromechanical building blocks 200 and 300 (see FIGS. 2a and 3a) are herein described as including a full reverse extender and a half reverse extender, respectively, it is understood that the building blocks 200 and 300 may alternatively include respective reverse extenders having any desired length, so long as the reverse extenders are disposed internal to the area of the respective bimorphs. Similarly, an optical surface such as the optical surface 10' (see FIG. 10) may have any desired length so long as it is disposed internal to the area of the arm 14' or 16'. For example, a bimorph suitably connected at one end to an optical surface conforming to the general configuration of a "quarter reverse extender" may be employed to implement an optical grating.

It will further be appreciated by those of ordinary skill in the art that modifications to and variations of the above-described devices and methods may be made without departing from the inventive concepts disclosed herein. Accordingly, the invention should not be viewed as limited except as by the scope and spirit of the appended claims.

What is claimed is:

1. A micro-electromechanical building block for constructing a micro-electromechanical device, comprising:

at least one bendable member having a first end connectable to a support structure and a predetermined length; and at least one straight rigid member having a first end connected to a second end of the respective bendable member, the rigid member extending toward the support structure in the event the respective bendable member is in a straight condition, wherein the rigid member has a length less than or equal to the predetermined length of the bendable member to allow a free end of the rigid member to undergo motion ranging from a pure rotation, a combined rotation and translation, to a pure translation in response to a displacement of the respective bendable member.

2. A micro-electromechanical device, comprising:
the micro-electromechanical building block of claim 1, wherein the rigid member has a length equal to one half the predetermined length of the bendable member to allow the free end of the rigid member to undergo a pure rotation in response to a displacement of the bendable member.

3. A micro-electromechanical device, comprising:
a first micro-electromechanical building block according to claim 1, the first building block including a first bendable member having a first predetermined length and a first rigid member, wherein the first rigid member has a length equal to the first predetermined length; and
a second micro-electromechanical building block according to claim 1, the second building block including a second bendable member having a second predetermined length and a second rigid member, wherein the second rigid member has a length equal to one half the second predetermined length,
wherein the free end of the first rigid member is connected to the first end of the second bendable member to allow the free end of the second rigid member to undergo a pure rotation in response to a displacement of at least the first bendable member.

4. A micro-electromechanical device, comprising:
a micro-electromechanical building block according to claim 1, the building block including a first bendable member having a first predetermined length and a rigid member having a length equal to one half the first predetermined length; and
a second bendable member connected to the free end of the rigid member to allow a free end of the second bendable member to undergo a pure translation in response to a displacement of at least the first bendable member.

5. A micro-electromechanical device, comprising:
a first bendable member having a first end connectable to a support structure and a predetermined length; and
a second bendable member having a first end connected to a second end of the first bendable member and extending away from the support structure in the event the first and second bendable members are in respective straight conditions, the second bendable member having a length equal to the predetermined length of the first bendable member,
wherein the first and second bendable members are configured to undergo respective displacements in opposite directions to allow a free end of the second bendable member to undergo a pure translation in response to a displacement of at least the first bendable member.

6. A micro-electromechanical device, comprising:
a first micro-electromechanical building block according to claim 1, the first building block including a first bendable member having a first predetermined length and a first rigid member having a length equal to one half of the first predetermined length; and
a second micro-electromechanical building block according to claim 1, the second building block including a second bendable member having a second predetermined length and a second rigid member having a length equal to one half of the second predetermined length,
wherein the free end of the first rigid member is connected to the first end of the second bendable member to allow the free end of the second rigid member to undergo a pure translation in response to a displacement of at least the first bendable member.

7. A micro-mechanical system of one or more platforms and plural supports wherein at least one platform is configured to have an optical surface, the system comprising:
a frame configured to hold one or more of the plural supports at respective ends thereof distant from a corresponding platform; and
a plurality of morph drivers coextensive and associated with a portion of respective ones of a plurality of the plural supports,
wherein remaining portions of the plural supports are angled to the portion to which the morphs are coextensive.

8. The system of claim 7 wherein
a first plurality of the supports extends from the frame to a first platform and a second plurality of the supports extends from the frame to a second platform, the first and second pluralities of supports having morph drivers associated therewith, and
a third plurality of the supports extends from the first and second platforms to a third platform, the third platform being adapted for an optical surface.

9. The system of claim 7 wherein the supports are configured for substantially forming a right angle.

10. The system of claim 9 wherein the supports number three in total, oriented at about 120 degrees from each other.

11. The system of claim 7 wherein a strain-relieving configuration is provided to connect the supports and the platforms.

12. The system of claim 7 further including electrical connections to the morphs from terminals on the frame configured to provide bending of the supports in different directions in response to a signal applied to the terminals.

13. The system of claim 7 further including electrical connections to the morphs from terminals on the frame configured to provide tilting of the platform in different directions in response to a signal applied to the terminals.

14. The system of claim 7 further including electrical connections to the morphs from terminals on the frame configured to provide bending of the platform in a convex or concave shape in response to a signal applied to the terminals.

15. The system of claim 7 wherein the supports comprise multiple arms selected from the group consisting of arms with morphs of a selected length and arms without morphs of a selected length.

16. The system of claim 7 wherein the supports and the platforms are made of silicon.

17. The system of claim 15 wherein the supports and the platforms are etch-released from the frame.

18. The system of claim 7 wherein the morphs are selected from the group consisting of mono-morphs and bimorphs.

19. The system of claim 7 wherein the morphs are piezoelectric elements applied to the supports.

20. A method for controlling a pointing angle of a light reflecting element, comprising the steps of:
providing a system as claimed in claim 1; and
applying signals to morphs of the system from a processor to produce angulation of the light reflecting element.

21. The method of claim 20 wherein the processor provides a coordinate transformation.

22. The method of claim 20 wherein the light reflecting element includes a mirror.

23. A method of forming a scanning system, comprising the steps of:

forming a micro-mechanical system of claim 7 from silicon.

24. The method of claim 23 further including forming the morphs as layered piezoelectric elements on silicon supports between the frame and the reflecting element.

25. The system of claim 9 wherein at least one platform takes on a convex or concave shape under the influence of a similar bending of the morphs.

26. A method for adjusting a focusing effect of the optical surface of claim 7, comprising the steps of:

causing the morphs to bend in substantially the same direction and magnitude to apply a bending moment to edges of the optical surface, thereby causing a bending thereof in a convex or concave shape.

27. A method for adjusting a focusing effect of the optical surface of claim 7, comprising the steps of:

causing the morphs to bend in respective directions and magnitudes to tilt the optical surface in a plurality of directions.

* * * * *

UNITED STATES PATENT AND TRADEMARK OFFICE
CERTIFICATE OF CORRECTION

PATENT NO. : 6,830,944 B1
APPLICATION NO. : 10/332559
DATED : December 14, 2004
INVENTOR(S) : Johannes G. Smits Page 1 of 1

It is certified that error appears in the above-identified patent and that said Letters Patent is hereby corrected as shown below:

Column 5, line 40, "106" should read --108--;

Column 5, line 58, "rotation a" should read --rotation $\alpha$--;

Column 7, line 54, "rotation a" should read --rotation $\alpha$--.

Signed and Sealed this

Fifth Day of June, 2007

JON W. DUDAS
*Director of the United States Patent and Trademark Office*